US012726176B2

(12) United States Patent
Li

(10) Patent No.: US 12,726,176 B2
(45) Date of Patent: Sep. 1, 2026

(54) BULK ACOUSTIC WAVE RESONATOR CAPABLE OF IMPROVING POWER CAPACITY AND PREPARATION METHOD THEREOF

(71) Applicant: HEYUAN AIFO LIGHT COMMUNICATION TECHNOLOGY CO., LTD., Guangdong (CN)

(72) Inventor: Guoqiang Li, Guangdong (CN)

(73) Assignee: HEYUAN AIFO LIGHT COMMUNICATION TECHNOLOGY CO., LTD., Guangdong (CN)

(*) Notice: Subject to any disclaimer, the term of this patent is extended or adjusted under 35 U.S.C. 154(b) by 674 days.

(21) Appl. No.: 18/271,325

(22) PCT Filed: Dec. 20, 2022

(86) PCT No.: PCT/CN2022/140389
§ 371 (c)(1),
(2) Date: Jul. 7, 2023

(87) PCT Pub. No.: WO2023/125150
PCT Pub. Date: Jul. 6, 2023

(65) Prior Publication Data

US 2024/0305267 A1 Sep. 12, 2024

(30) Foreign Application Priority Data

Dec. 29, 2021 (CN) ......................... 202111640341.1

(51) Int. Cl.
*H03H 9/17* (2006.01)
*H03H 3/02* (2006.01)

(52) U.S. Cl.
CPC .............. *H03H 9/173* (2013.01); *H03H 3/02* (2013.01); *H03H 9/176* (2013.01); *H03H 2003/021* (2013.01)

(58) Field of Classification Search
CPC .......... H03H 9/173; H03H 9/02; H03H 9/176; H03H 9/17; H03H 9/02102; H03H 9/171; H03H 2003/021; H03H 2003/023
See application file for complete search history.

(56) References Cited

U.S. PATENT DOCUMENTS 7,140,084 B2 * 11/2006 Yamada ................. H03H 9/587 29/25.35
11,764,750 B2 * 9/2023 Hou ......................... H03H 3/02 310/341

(Continued)

FOREIGN PATENT DOCUMENTS

CN 109474252 A 3/2019
CN 114389562 A 4/2022

OTHER PUBLICATIONS

International Search Report dated Feb. 23, 2023 for International Application PCT/CN2022/140389.

(Continued)

*Primary Examiner* — Emily P Pham
(74) *Attorney, Agent, or Firm* — Farjami & Farjami LLP

(57) ABSTRACT

A bulk acoustic wave resonator capable of improving a power capacity includes a substrate, a first diamond film layer, a piezoelectric layer and a second diamond film layer; a first cavity is formed in the first diamond film layer; a bottom electrode is arranged on the first diamond film layer and located in the piezoelectric layer; a second cavity is formed in the second diamond film layer, and a top electrode is arranged in the second cavity on the piezoelectric layer; a first through hole is formed between the top electrode and the bottom electrode, and the first through hole penetrates (Continued)

through the top electrode and the bottom electrode, and communicates with the first cavity and the second cavity; and a second through hole is further formed in the second diamond film layer, and the second through hole communicates with the second cavity and the outside.

10 Claims, 3 Drawing Sheets

(56) References Cited

U.S. PATENT DOCUMENTS

2003/0000058 A1* 1/2003 Tsai ........................ H03H 3/02
29/25.35
2005/0140247 A1 6/2005 Lee
2007/0044296 A1 3/2007 Jeon
2021/0159873 A1 5/2021 Jan

OTHER PUBLICATIONS

Written Opinion dated Feb. 23, 2023 for International Application PCT/CN2022/140389.

* cited by examiner

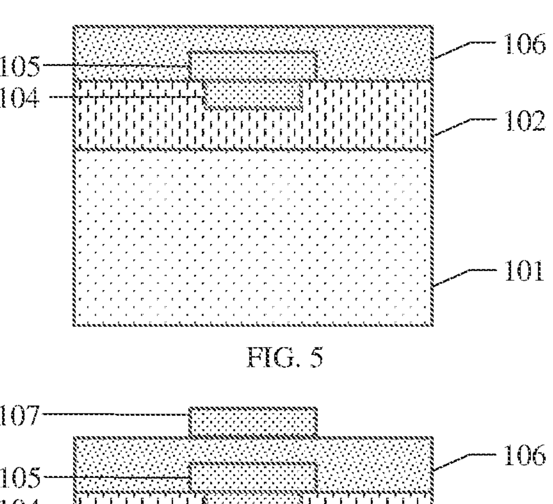
FIG. 5
FIG. 6
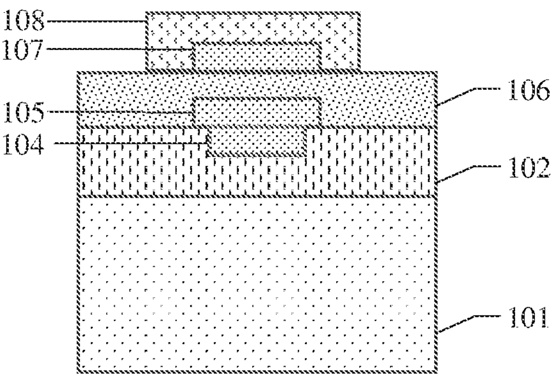
FIG. 7
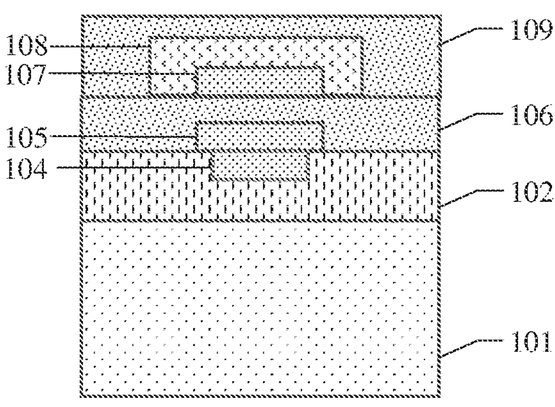
FIG. 8

BULK ACOUSTIC WAVE RESONATOR CAPABLE OF IMPROVING POWER CAPACITY AND PREPARATION METHOD THEREOF

CROSS-REFERENCE TO RELATED APPLICATIONS

This application is a national stage filing under 35 U.S.C. § 371 of international application number PCT/CN2022/140389, filed Dec. 20, 2022, which claims priority to Chinese patent application No. 2021116403411 filed Dec. 29, 2021. The contents of these applications are incorporated herein by reference in their entirety.

TECHNICAL FIELD

The disclosure relates to the technical field of bulk acoustic wave resonators, and particularly to a bulk acoustic wave resonator capable of improving power capacity and a preparation method thereof.

BACKGROUND

With the rapid development of 5G technology, radio frequency front end devices are also developing towards high frequency and miniaturization. Film bulk acoustic wave filter has the advantages of a small size, a high quality factor, a high out-of-band rejection and compatibility with CMOS technology, and is the only filter capable of being monolithically integrated with the radio frequency front end device at present. The film bulk acoustic wave resonator is a basic unit module constituting the filter, an electrical signal is converted into an acoustic signal through a piezoelectric material, and an acoustic wave is totally reflected on upper and lower surfaces of the piezoelectric material, thus forming resonance. There is an air cavity between a lower surface of a bottom electrode and an upper surface of a silicon substrate, and acoustic impedance between air and the electrode is quite different, so that the acoustic wave can be totally reflected. However, the thermal conductivity of air is approximate to zero, so that Joule heat generated by the resonator will accumulate inside the resonator, and can only spread along the surface of the substrate, while the self-heating phenomenon will seriously reduce a power capacity of the filter, and this problem has not been effectively solved.

SUMMARY

Aiming at the problems in the existing technology, the disclosure provides a bulk acoustic wave resonator capable of improving a power capacity and a preparation method thereof, which can effectively reduce a temperature of a filter, thus greatly improving a power capacity of the filter. Technical solutions of the disclosure are provided as follows.

In a first aspect, an embodiment of the disclosure provides a bulk acoustic wave resonator capable of improving a power capacity, which comprises a substrate, a first diamond film layer, a piezoelectric layer and a second diamond film layer from sequentially bottom to top, wherein a first cavity is formed in the first diamond film layer; a bottom electrode is arranged on an upper surface of the first diamond film layer and located in the piezoelectric layer, and the bottom electrode is partially exposed to the first cavity; a second cavity is formed in the second diamond film layer, and a top electrode is arranged in the second cavity and located on an upper surface of the piezoelectric layer; a first through hole is formed between the top electrode and the bottom electrode, and the first through hole penetrates through the top electrode and the bottom electrode, and communicates with the first cavity and the second cavity; and a second through hole is further formed in the second diamond film layer, and the second through hole communicates with the second cavity and the outside.

Optionally, the substrate is made of silicon.

Further, the first diamond film layer has a thickness ranging from 10 μm to 30 μm.

Further, the second diamond film layer has a thickness ranging from 50 μm to 150 μm.

Further, the first cavity and the second cavity have a depth ranging from 3 μm to 5 μm.

Preferably, two first through holes are formed.

Preferably, two second through holes are formed.

Preferably, the piezoelectric layer is made of AlN or lithium niobate.

In a second aspect, an embodiment of the disclosure provides a preparation method of the bulk acoustic wave resonator capable of improving a power capacity, which comprises the following steps of:

(1) taking a substrate, and depositing a layer of diamond film on a surface of the substrate to form the first diamond film layer;
(2) preparing a cavity in the first diamond film layer, depositing first phosphosilicate glass in the cavity, and polishing a surface of the first phosphosilicate glass to make the first phosphosilicate glass flush with a surface of the first diamond film layer;
(3) depositing a bottom electrode on the first diamond film layer, and carrying out a patterning treatment, wherein the bottom electrode is in complete contact with the surface of the first phosphosilicate glass;
(4) depositing the piezoelectric layer on a surface of the bottom electrode, and completely covering the bottom electrode with the piezoelectric layer;
(5) preparing a top electrode on the piezoelectric layer;
(6) depositing second phosphosilicate glass on a surface of the top electrode, and carrying out a patterning treatment on the second phosphosilicate glass, so as to completely cover the top electrode with the second phosphosilicate glass;
(7) preparing the second diamond film layer on a surface of the second phosphosilicate glass, and completely covering the second phosphosilicate glass with the second diamond film layer;
(8) preparing the second through hole in the second diamond film layer, and preparing the first through hole between the top electrode and the bottom electrode; and
(9) soaking the device obtained in the step (8) in an etching solution to remove the first phosphosilicate glass and the second phosphosilicate glass.

Further, preparing a cavity in step (2) is realized by RIE, ICP or chemical etching.

Further, the first phosphosilicate glass polished in step (2) has a roughness less than 0.5 nm.

Further, the depositing the piezoelectric layer on a surface of the bottom electrode in step (4) is realized by radio frequency magnetron sputtering, trimethyl aluminum and $NH_3$ are used as reaction gases, which have flow rates of 50 sccm and 3 slm respectively, a carrier gas is Ar, which has a flow rate of 1 slm, and a control system has a temperature ranging from 930° C. to 960° C., and a pressure ranging from 38 Torr to 42 Torr.

Compared with the existing technology, the disclosure has the following beneficial effects and advantages.

According to the resonator of the disclosure, a heat dissipation performance of the resonator can be greatly enhanced, a temperature of the resonator is further greatly reduced, and finally a power capacity of the resonator is improved. Compared with an existing common resonator, the method provided by the disclosure can improve the power capacity of the filter by more than 30%.

BRIEF DESCRIPTION OF THE DRAWINGS

FIG. 5 is a cross-sectional view of a piezoelectric layer prepared on a surface of the bottom electrode in Embodiment One of the disclosure.

FIG. 6 is a cross-sectional view of a top electrode prepared on the piezoelectric layer in Embodiment One of the disclosure.

FIG. 7 is a cross-sectional view of a second phosphosilicate glass deposited on a surface of the top electrode in Embodiment One of the disclosure.

FIG. 8 is a cross-sectional view of a second diamond film layer prepared on a surface of the second phosphosilicate glass in Embodiment One of the disclosure.

In FIG. 1 to FIG. 10, 101 refers to substrate, 102 refers to first diamond film layer, 103 refers to first cavity, 104 refers to first phosphosilicate glass, 105 refers to bottom electrode, 106 refers to piezoelectric layer, 107 refers to top electrode, 108 refers to second phosphosilicate glass, 109 refers to second diamond film layer, 110 refers to second through hole, 111 refers to first through hole, and 112 refers to second cavity.

DETAILED DESCRIPTION

In the description of the disclosure, it should be noted that, if the specific conditions are not indicated in the embodiments, the conventional conditions or the conditions suggested by the manufacturer should be followed. If the manufacturer of the reagent or the instrument used is not indicated, the reagent or the instrument is regarded as a commercially available conventional product.

The disclosure is further described in detail hereinafter with specific embodiments, so as to help those having ordinary skills in the art to have a more complete, accurate and in-depth understanding of the inventive concept and technical solution of the disclosure. The scope of protection of the disclosure comprises but is not limited to the following embodiments, and any modification to the details and forms of the technical solution of the disclosure should fall within the scope of protection of the disclosure without deviating from the gist and scope of the present application.

Embodiment One

Figure 10:
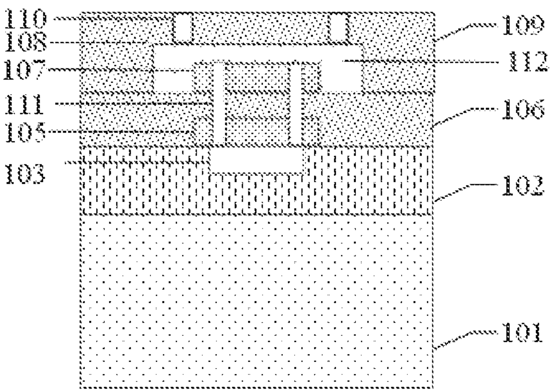
FIG. 10 is a cross-sectional view of a resonator finally obtained in Embodiment One of the disclosure.

This embodiment provides a bulk acoustic wave resonator capable of improving a power capacity, as shown in FIG. 10, the bulk acoustic wave resonator comprises a substrate 101, a first diamond film layer 102, a piezoelectric layer 106 and a second diamond film layer 109 from sequentially bottom to top. A first cavity 103 is formed in the first diamond film layer 102. A bottom electrode 105 is arranged on an upper surface of the first diamond film layer 102 and located in the piezoelectric layer 106, and the bottom electrode 105 is partially exposed to the first cavity 103. A second cavity 112 is formed in the second diamond film layer 109, and a top electrode 107 is arranged in the second cavity 112 and located on an upper surface of the piezoelectric layer 106. A first through hole 111 is formed between the top electrode 107 and the bottom electrode 105, and the first through hole 111 penetrates through the top electrode 107 and the bottom electrode 105, and communicates with the first cavity 103 and the second cavity 112. A second through hole 110 is further formed in the second diamond film layer 109, and the second through hole 110 communicates with the second cavity 112 and the outside.

In this embodiment, the bottom electrode and the top electrode are both made of a metal material Mo, and both have a thickness of 400 nm. The piezoelectric layer is made of AlN, and has a thickness of 1 μm. The first diamond film layer has a thickness of 30 μm, and the second diamond film layer has a thickness of 100 μm. The first cavity has a depth of 3 μm, and the second cavity has a depth of 3 μm.

This embodiment further provides a preparation method of the bulk acoustic wave resonator above, which comprises the following steps.

Figure 1:
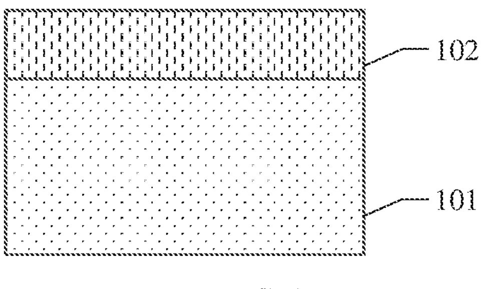
FIG. 1 is a cross-sectional view of a first diamond film layer formed on a surface of a silicon substrate in Embodiment One of the disclosure.
Figure 2:
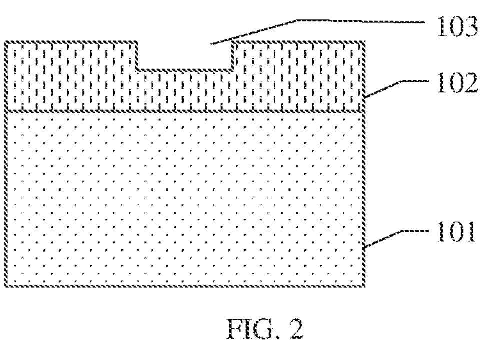
FIG. 2 is a cross-sectional view of a first cavity in the first diamond film layer in Embodiment One of the disclosure.

(1) The Si (111) substrate 101 is selected, and the substrate is soaked in acetone and hydrofluoric acid buffer solutions sequentially and dried. The first diamond film layer 102 (FIG. 1) is deposited on a surface of the silicon substrate through chemical vapor deposition, and the first diamond film layer has the thickness of 30 μm. The cavity with the depth of 3 μm is prepared on a surface of a diamond film through plasma etching, and a cross-sectional view of the cavity is shown as 103 in FIG. 2.

Figure 3:
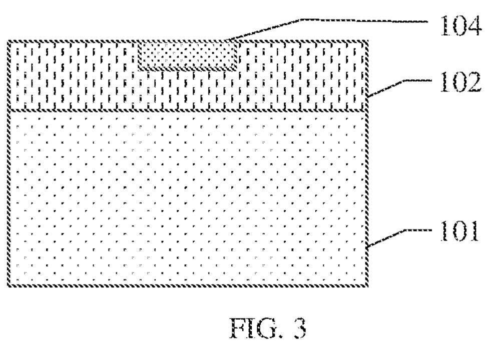
FIG. 3 is a cross-sectional view of a sacrificial layer in the first cavity in Embodiment One of the disclosure.

(2) The first phosphosilicate glass 104 (FIG. 3) is deposited in the cavity through plasma-enhanced chemical vapor deposition, a thickness of a sacrificial layer is slightly greater than the depth of the cavity, and finally the sacrificial layer is polished, with a roughness that should be less than 0.5 nm.

Figure 4:
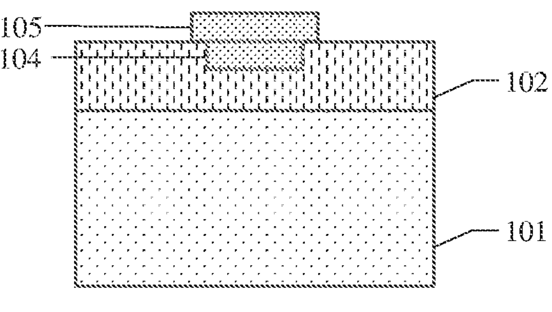
FIG. 4 is a cross-sectional view of a bottom electrode prepared above the first diamond film layer in Embodiment One of the disclosure.

(3) The metal Mo bottom electrode 105 with the thickness of 400 nm is deposited on the first diamond film layer through magnetron sputtering, and then the metal Mo bottom electrode is subjected to a patterning treatment (FIG. 4), so that the bottom electrode is in complete contact with a surface of the first phosphosilicate glass.

(4) The AlN piezoelectric layer 106 is deposited on a surface of the bottom electrode through a radio frequency magnetron sputtering system, with the thickness of 1 μm, reaction gases are trimethyl aluminum (50 sccm) and $NH_3$ (3 slm), a carrier gas is Ar (1 slm), a system temperature is about 950° C., and a total pressure of a reaction chamber is about 40 Torr (FIG. 5).

(5) The Mo top electrode 107 (FIG. 6) with the thickness of 400 nm is prepared on a surface of the AlN piezoelectric layer through stripping.

(6) The second phosphosilicate glass 108 (FIG. 7) is deposited on a surface of the top electrode through plasma-enhanced chemical vapor deposition, and a patterning treatment is carried out on the second phosphosilicate glass, so as to completely cover the top electrode with the second phosphosilicate glass.

(7) The second diamond film layer 109 is prepared on a surface of the second phosphosilicate glass through chemical vapor deposition, with the thickness of 100 μm, and the second phosphosilicate glass is completely covered with the second diamond film layer.

Figure 9:
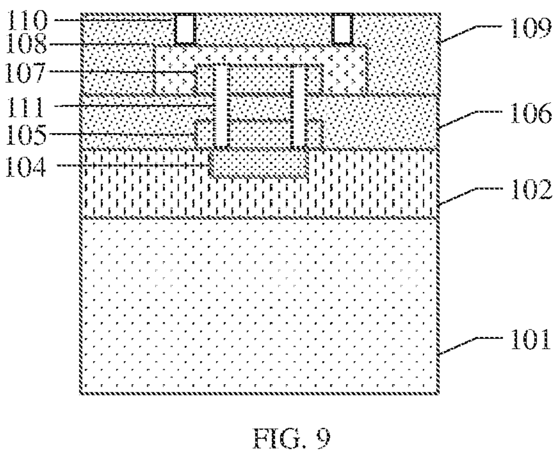
FIG. 9 is a cross-sectional view of a first through hole and a second through hole prepared in Embodiment One of the disclosure.

(8) The second through hole 110 is etched in the second diamond film layer, and the first through hole 111 (FIG. 9) is etched in the top electrode, the piezoelectric layer and the bottom electrode.

(9) The device prepared above is soaked in a diluted hydrofluoric acid solution and then released, and all phosphosilicate glass in the device (FIG. 10) is removed.

The resonator obtained in this embodiment has a power capacity of 2.6 W, and the resonator at this power has a highest temperature of 150° C.

Comparative Example One

This comparative example provides an existing bulk acoustic wave resonator, a structure of which comprises an air cavity, a bottom electrode and a piezoelectric material AlN, and the bulk acoustic wave resonator is a conventional resonator in the field, and will not be described in detail herein. The bottom electrode and the top electrode are both made of a metal material Mo, and both have a thickness of 400 nm. The piezoelectric layer is made of AlN, and has a thickness of 1 μm. The air cavity below the bottom electrode has a depth of 3 μm. The resonator takes silicon as the substrate.

The resonator in this comparative example has a power capacity of about 2 W, and the resonator at this power has a highest temperature of about 140° C. Compared with the resonator of Comparative Example One, the resonator of Embodiment One has a power capacity increased by 30%, and has a bearable maximum temperature increased by 10° C.

The above embodiments merely express several embodiments of the disclosure, and the descriptions thereof are relatively specific and detailed, but cannot be understood as a limitation to the scope of the disclosure. It should be noted that those of ordinary skills in the art may make a plurality of transformations and improvements without departing from the conception of the disclosure, and these transformations and improvements should all fall within the scope of protection of the disclosure. Therefore, the scope of protection of the invention patent should be subjected to the claims appended.

What is claimed is:

1. A bulk acoustic wave resonator capable of improving a power capacity, comprising a substrate, a first diamond film layer, a piezoelectric layer and a second diamond film layer sequentially from bottom to top, wherein a first cavity is formed in the first diamond film layer; a bottom electrode is arranged on an upper surface of the first diamond film layer and located in the piezoelectric layer, and the bottom electrode is partially exposed to the first cavity; a second cavity is formed in the second diamond film layer, and a top electrode is arranged in the second cavity and located on an upper surface of the piezoelectric layer; a first through hole is formed between the top electrode and the bottom electrode, and the first through hole penetrates through the top electrode and the bottom electrode, and communicates with the first cavity and the second cavity; and a second through hole is further formed in the second diamond film layer, and the second through hole communicates with the second cavity and outside.

2. The bulk acoustic wave resonator capable of improving a power capacity according to claim 1, wherein the first diamond film layer has a thickness ranging from 10 μm to 30 μm.

3. The bulk acoustic wave resonator capable of improving a power capacity according to claim 1, wherein the second diamond film layer has a thickness ranging from 50 μm to 150 μm.

4. The bulk acoustic wave resonator capable of improving a power capacity according to claim 1, wherein the first cavity and the second cavity have a depth ranging from 3 μm to 5 μm.

5. The bulk acoustic wave resonator capable of improving a power capacity according to claim 1, wherein two first through holes are formed.

6. The bulk acoustic wave resonator capable of improving a power capacity according to claim 1, wherein two second through holes are formed.

7. The bulk acoustic wave resonator capable of improving a power capacity according to claim 1, wherein the piezoelectric layer is made of AlN or lithium niobate.

8. A preparation method of the bulk acoustic wave resonator capable of improving a power capacity according to claim 1, comprising the following steps of:

(1) taking a substrate, and depositing a layer of diamond film on a surface of the substrate to form the first diamond film layer;

(2) preparing a cavity in the first diamond film layer, depositing a first phosphosilicate glass in the cavity, and polishing a surface of the first phosphosilicate glass to make the first phosphosilicate glass flush with a surface of the first diamond film layer;

(3) depositing the bottom electrode on the first diamond film layer, and carrying out a patterning treatment, wherein the bottom electrode is in complete contact with the surface of the first phosphosilicate glass;

(4) depositing the piezoelectric layer on a surface of the bottom electrode, and completely covering the bottom electrode with the piezoelectric layer;

(5) preparing the top electrode on the piezoelectric layer;

(6) depositing a second phosphosilicate glass on a surface of the top electrode, and carrying out a patterning treatment on the second phosphosilicate glass, so as to completely cover the top electrode with the second phosphosilicate glass;

(7) preparing the second diamond film layer on a surface of the second phosphosilicate glass, and completely covering the second phosphosilicate glass with the second diamond film layer;

(8) preparing the second through hole in the second diamond film layer, and preparing the first through hole between the top electrode and the bottom electrode; and (9) soaking a device obtained in step (8) in an etching solution to remove the first phosphosilicate glass and the second phosphosilicate glass.

9. The preparation method of the bulk acoustic wave resonator capable of improving a power capacity according to claim 8, wherein the first phosphosilicate glass polished in step (2) has a roughness less than 0.5 nm.

10. The preparation method of the bulk acoustic wave resonator capable of improving a power capacity according to claim 8, wherein the depositing the piezoelectric layer on a surface of the bottom electrode in step (4) is realized by radio frequency magnetron sputtering, trimethyl aluminum and $NH_3$ are used as reaction gases, which have flow rates of 50 sccm and 3 slm respectively, a carrier gas is Ar, which has a flow rate of 1 slm, and a control system has a temperature ranging from 930° C. to 960° C., and a pressure ranging from 38 Torr to 42 Torr.

* * * * *